United States Patent
Stephenson

[19]

[11] Patent Number: 5,858,581
[45] Date of Patent: Jan. 12, 1999

[54] METHOD OF PRODUCING A DISPLAY HAVING A PATTERNABLE CONDUCTIVE TRACES

[75] Inventor: Stanley W. Stephenson, Spencerport, N.Y.

[73] Assignee: Eastman Kodak Company, Rochester, N.Y.

[21] Appl. No.: 990,891

[22] Filed: Dec. 15, 1997

[51] Int. Cl.[6] .............................. G03C 5/30; G03C 5/26; G02F 1/1335; G02F 1/1343
[52] U.S. Cl. .............................. 430/7; 430/311; 430/319; 430/321; 430/503; 430/564
[58] Field of Search .............................. 430/7, 311, 319, 430/321, 503, 564; 349/139, 143

[56] References Cited

U.S. PATENT DOCUMENTS

| | | | |
|---|---|---|---|
| 3,033,765 | 5/1962 | King et al. | 205/118 |
| 3,464,822 | 9/1969 | Blake et al. | 430/311 |
| 3,720,515 | 3/1973 | Stanley | 430/313 |
| 5,049,480 | 9/1991 | Nebe et al. | 430/281.1 |
| 5,462,822 | 10/1995 | Roosen et al. | 430/7 |

FOREIGN PATENT DOCUMENTS 62-141502   6/1987   Japan .

Primary Examiner—John A. McPherson
Attorney, Agent, or Firm—Raymond L. Owens

[57] ABSTRACT

A method of fabricating a display having light sensitive conductive traces, including providing first and second light sensitive layers respectively over both sides of an electrically sensitive light modulating layer, the first and second light sensitive layers being conductive and patternable; patterning the first light sensitive layer to a first wavelength of radiation to form first conductive traces; and patterning the second light sensitive layer to a second wavelength of radiation to form second conductive traces.

6 Claims, 10 Drawing Sheets

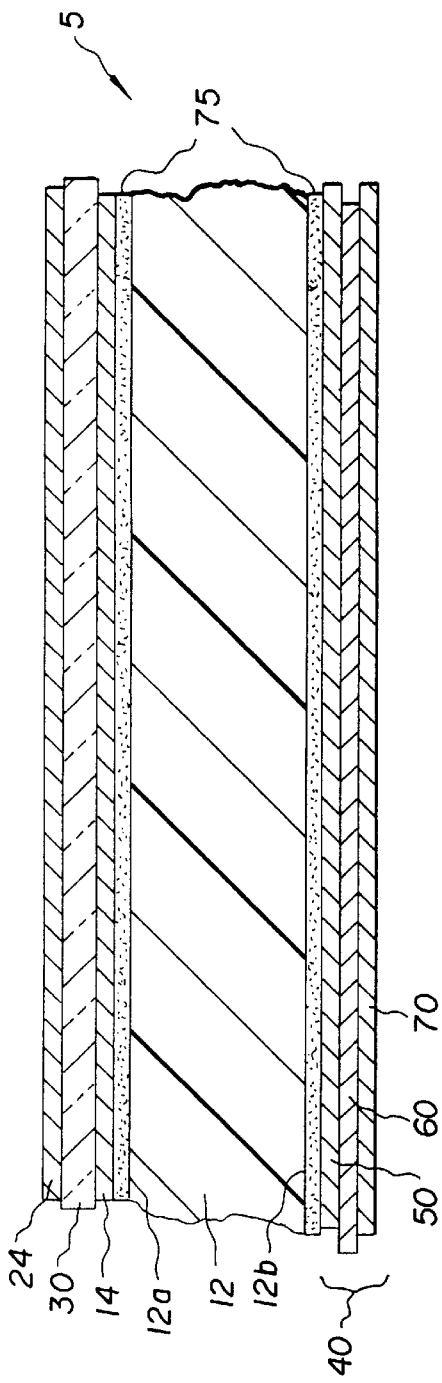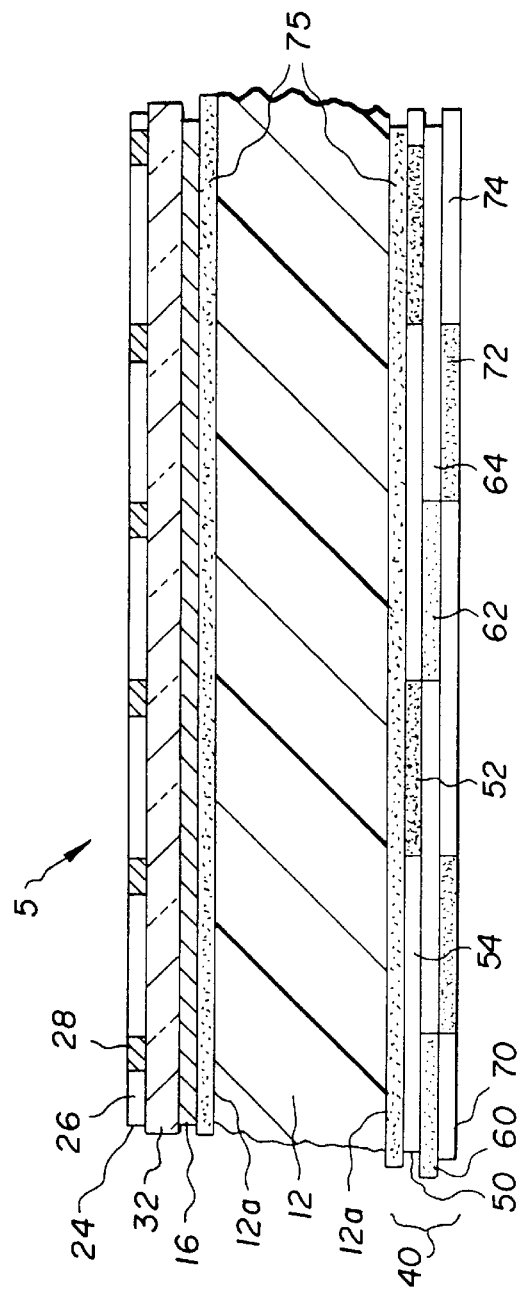

METHOD OF PRODUCING A DISPLAY HAVING A PATTERNABLE CONDUCTIVE TRACES

CROSS REFERENCE TO RELATED APPLICATIONS

The present invention is related to commonly assigned U.S. patent application Ser. No. 08/990,853 filed concurrently herewith, entitled "A Sheet Having Patternable Conductive Traces for Use in a Display" by Stanley W. Stephenson, U.S. patent application Ser. No. 08/961,059 filed Oct. 30, 1997, entitled "Display Apparatus Using Light Patternable Conductive Traces" by Stanley W. Stephenson and U.S. patent application Ser. No. 08/961,056 filed Oct. 30, 1997, entitled "Single Sheet Display Having Patternable Conductive Traces" by Stanley W. Stephenson, the disclosure of these related applications are incorporated herein by reference.

FIELD OF THE INVENTION

The present invention relates to image displays. The invention is directed to flat panel displays that use electrically modulated signals to control light passing through thin multi-layered plate.

BACKGROUND OF THE INVENTION

Flat panel displays can be fabricated using many techniques. Typical embodiments are disclosed in *Liquid Crystal Flat Panel Displays* by William C. O'Mara (Chapman & Hall, New York, 1993), and other similar publications. These displays use transparent glass plates as substrates, and electrical traces are sputtered in a pattern of parallel lines that form a first set of conductive traces. A transparent conductor such as Indium Tin Oxide is sputtered over the traces to disperse an electrical charge across transparent areas not blocked by the traces. A second substrate is similarly coated with a set of traces having a transparent conductive layer. Layers are applied over the substrates and patterned to orient liquid crystals in twisted nematic (TN) or super-twisted-nematic (STN) configurations. The two substrates are spaced apart and the space between the two substrates is filled with a liquid crystal material. Pairs of conductors from either set are selected and energized to alter the optical transmission properties of the liquid crystal material.

In another embodiment, the traces do not define an orthogonal grid, but form graphical symbols or organized to form alpha-numeric displays. In a further embodiment, an active display on a transparent substrate is sputtered or printed and uses memory elements to continuously drive a each display element depending on information written to the memory element. In another embodiment, disclosed in SID DIGEST 90, article 12.6, the liquid crystal material can be polymerically dispersed to form a Liquid Crystal Polymer Matrix (LCPC). LCPCs are typically disposed in ultra-violet polymerized acrylic polymers. The liquid crystals are homogenized into the polymer, and the emulsion is coated onto a substrate. Ultra violet light is applied to the emulsion. The emulsion hardens, and bubbles of liquid crystal material are held in a rigid polymeric matrix.

Image displays can provide color images if a color filter array is formed over the pixels of the display. In U.S. Pat. No. 5,462,822, three color layers are formed on a transparent substrate. In this patent, a transparent electrode layer is formed over the color filter. The filter plate is aligned onto a liquid crystal layer. The plate is glass and has silver halide, color-forming layers. A transparent electrode material is sputtered at high temperature over the CFA. In practice, the presence of the transparent electrode material causes ionic migration of the dyes in the dye layers. It would be advantageous to separate the electrically conductive layer from the dye layers.

The prior art requires many multiple, separate layers to build up the display. The electrical traces and transparent conductive layers are typically formed through repeated deposition of materials on the substrate through vacuum deposition. These processes are expensive and require long processing times on capital intensive equipment. It would advantageous to lower the cost of flat panel displays. Additionally, current structures are not amenable to the creation of low-cost large flat panel displays. It would be advantageous to be able to form low-cost, large flat-panel displays.

SUMMARY OF THE INVENTION

It is an object of the present invention to provide a display apparatus which overcomes the problems noted above.

Another object of the present invention is to produce conductive traces for modulating a display using light exposure and chemical processing.

These objects are achieved in a method of fabricating a display having light sensitive conductive traces, comprising the steps of:

a) providing first and second light sensitive layers respectively over both sides of an electrically sensitive light modulating layer, the first and second light sensitive layers being conductive and patternable;

b) patterning the first light sensitive layer to a first wavelength of radiation to form first conductive traces; and c) patterning the second light sensitive layer to a second wavelength of radiation to form second conductive traces.

The invention is particularly useful in that it can form traces in the layers using light and masks to generate electrically responsive, light controlling areas in the film. The sensitize sheet is then chemically processed to generate electrically responsive, light controlling structures in the film.

The invention produces a display using low-cost, low-temperature layers and processes. The display can utilize low-cost photographic layer technology. Light passing through masks controls the formation of traces and color filters. It employs a light modulating layer and patterned conductive traces. Large volumes of sheet material can be coated and formed into different types of displays by varying the exposure of light sensitive material.

BRIEF DESCRIPTION OF THE DRAWINGS

FIG. 1 is a section view of an unprocessed sheet used in the method of the present invention;

FIG. 2 is a sectional view of the sheet of FIG. 1 processed in accordance with the present invention;

FIG. 4b is a broken sectional view of FIG. 4a;

FIG. 5b is a broken sectional view of FIG. 5a;

FIG. 11b is a sectional view taken along the lines A—A of FIG. 11a.

DETAILED DESCRIPTION OF THE INVENTION

Figure 3:
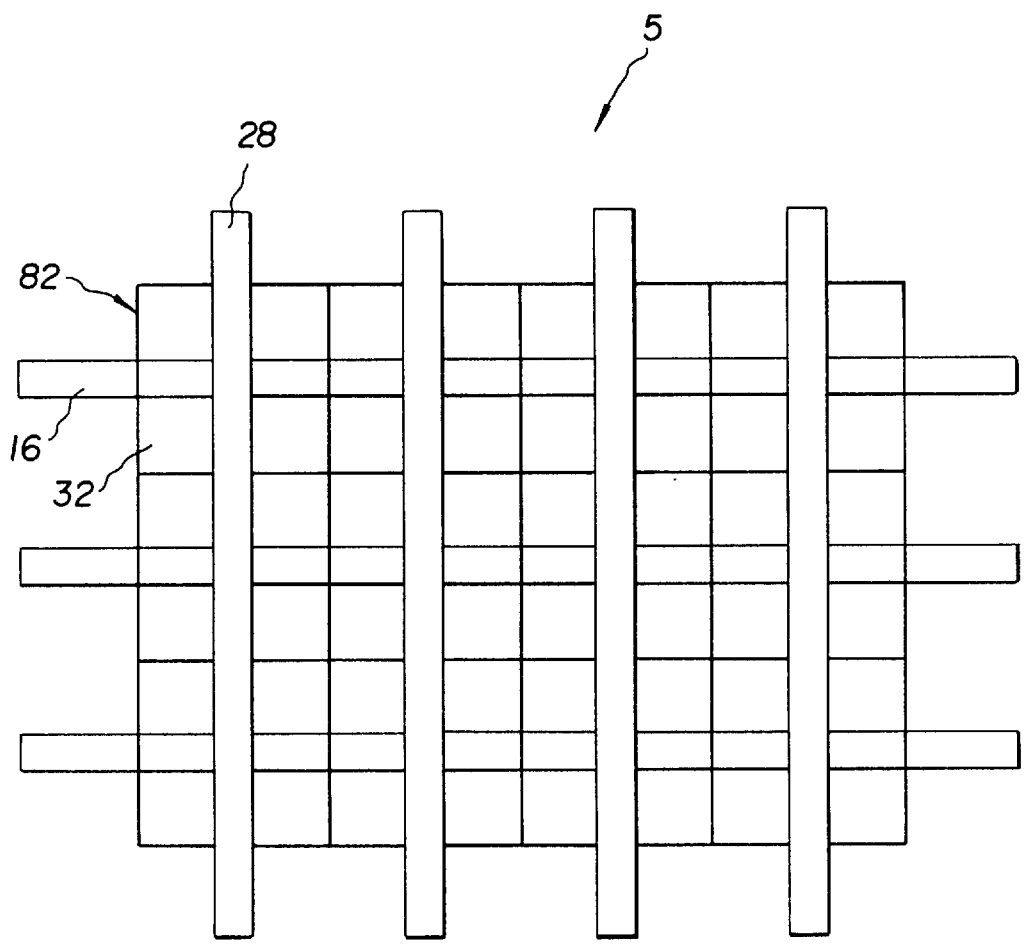
FIG. 3 is a top view of the completed display in accordance with the invention.

Referring to FIG. 1, an unprocessed display 5 includes a substrate 12 is used which can be a clear transparent material such as Kodak Estar film base formed of polyester plastic and has a thickness of between 20 an 200 microns. In the exemplary embodiment, the first substrate is a 80 micron thick sheet of polyester film base. Other clear polymers, such as polycarbonate can also be used. Substrate 12 has a first surface 12a that supports a light sensitive metal forming layer 14.

Preferably, the light sensitive metal forming layer 14 is an emulsion of silver halide grains. Alternatively, other light sensitive, metal forming materials can be used such as gold or copper salts. In the case of silver halide emulsions, high concentrations of silver halide salts in gelatin are used to improve conductivity over conventional imaging emulsions. Conductive additives such as fine Indium-Tin-Oxide or particulate silver with diameters between 0.5 and 2.0 microns are added to emulsion to improve conductivity as metallic silver is formed.

Over the first light sensitive layer 14 is a coatable light modulating layer 30. Light modulating layer 30 can be a liquid crystal of conventional design. In one embodiment, a liquid crystal material is homogenized in a polymeric binder such as gelatin. The liquid crystal, gelatin emulsion is coated to a thickness of between 1 and 30 microns to optimize light modulating of the layer. Other light-modulating, electrically operated materials can also be coated such as a microencapsulated ferroelectric (FLC) material in gelatin.

A second light sensitive layer 24 is applied over the light modulating layer 30. Light sensitive layer is similar to first light sensitive layer 14. The second light sensitive layer 24 is sensitized to a different wavelength of light. In the case of silver halide emulsions, conventional light sensitizers are used. In one embodiment, the first light sensitive layer 14 is silver halide emulsion sensitized to green light. The second light sensitive layer 24 is a silver halide emulsion sensitized to red or infra-red radiation.

In FIG. 2, each of the light sensitive layers 24 has been exposed to their respective sensitized color of light through one or more masks and developed to form non-conducting areas 26 and conducting areas 28.

A second surface 12b of substrate 12 supports a color filter array 40. Color filter array 40 can be a single layer printed on substrate 12 before first light sensitive layer 14 is applied to substrate 12. Alternatively, color filter array 40 can be a three layer of silver halide color dye forming chemistry, each layer forming a separate color of color filter array 40. An example of such a multi-layer array can be found in U.S. Pat. No. 5,462,822. That invention sputters a conductive layer under high temperature over the color filter array. In this invention, the conductive layer is metallic traces disposed on the opposite side of substrate 12.

In accordance with this invention the color filter array 40 can be disposed on the second surface 12b of the substrate 12 in the case of silver halide color dye forming emulsions. Metal forming processes that are used to create electrically conducting traces 16 and 28 require retention of the metallic silver. In the case of color dye forming silver halide emulsions, the opaque metallic silver must be removed to permit transmission of light through the formed dyes. Disposing the color forming silver halide emulsions on second substrate surface 12b and the metal forming silver halide on the first substrate surface 12a permits the separate chemical processing of the layers. In the case of having the color filter array 40 formed on the second substrate surface 12b, the size of the formed pixels must be significantly greater than the thickness of the sheet to prevent light from one modulated pixel from illuminating a different color filter area. In the case of the 80 micron thick substrate 12, the dimensions of the pixels should be greater than 5 times the thickness of the substrate 12, or greater than 400 microns.

FIG. 2 includes an exposed and developed color filter array 40. A red filter layer 50 is a silver halide emulsion layer that has been exposed and developed to create red filter dyed areas 52 and red filter undyed areas 54. A second green filter layer 60 is a silver halide emulsion layer that has been exposed and developed to form green filter dye areas 62 and green filter undyed areas 64. A blue filter layer 70 is a silver halide emulsion that has been exposed and developed to from blue filter dyed areas 72 and blue filter undyed areas 74. The exposure and development of the multi-layer color filter array 40 can be done before application of layers on the first substrate surface 12a of the substrate 12. Alternatively, color filter array 50 can be printed as a single layer on the same side as the light modulating emulsions using non-light sensitized printing processes such as screen printing. In the case that the color filter array 40 is formed before traces are formed, the trace mask 90 (FIG. 6) that forms traces in the light sensitive layers 14 and 28 is aligned to color filter array 40 so that formed traces align to color filter array 40.

In a preferred embodiment all layers on both sides of substrate 12 are processed. Layers of light absorbing material 75 are coated on one or both sides of the substrate 12. Light absorbing material 75 can be formulations well known in the art that provide anti-halation layers on silver halide films. The additional layers permit independent exposure of the layers on the first and second substrate surfaces 12a and 12b, respectively. Light absorbing material 75 is soluble in the solutions used to develop the light sensitive layers 14 and 24 so that the substrate 12 is optically transmitting after the display 5 has been processed.

The top view of a completed display 5 is shown in FIG. 3. For sake of clarity, it is assumed that the light modulating material 32 has been driven to a transparent state and no color filter array has been applied to the second substrate surface 12b. Vertical traces 28 in second light sensitive layer 24 and are formed by lines of green light. Light modulating layer 30 is transparent in the drawing. Horizontal traces 16 are formed in first light sensitive layer 14 using lines of red or infra-red light.

In this preferred embodiment, display 5 is designed to produce images according to video standard SMPTE 274M.

Horizontal traces 16 can consist of 1080 traces that are 100 microns wide with 400 micron gaps between lines. There are 1920 vertical traces 28 which are 100 microns wide with 400 micron gaps between lines. A clear aperture 82 is 400 microns square in a 500 square micron pixel.

Figure 4A:
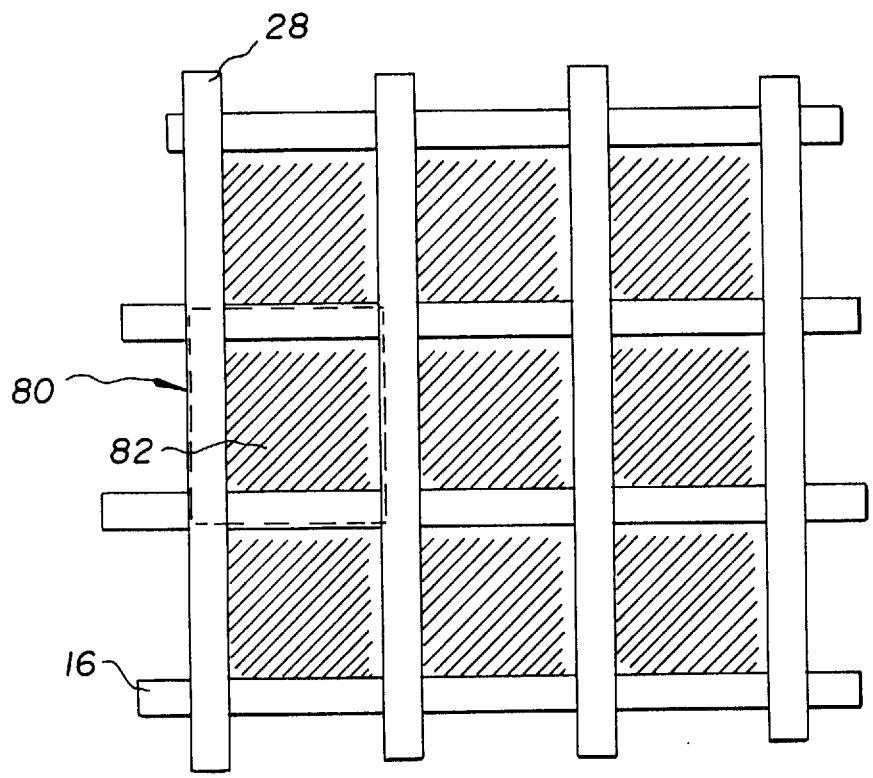
FIG. 4a is a partial top view of the display of FIG. 3.
Figure 4B:
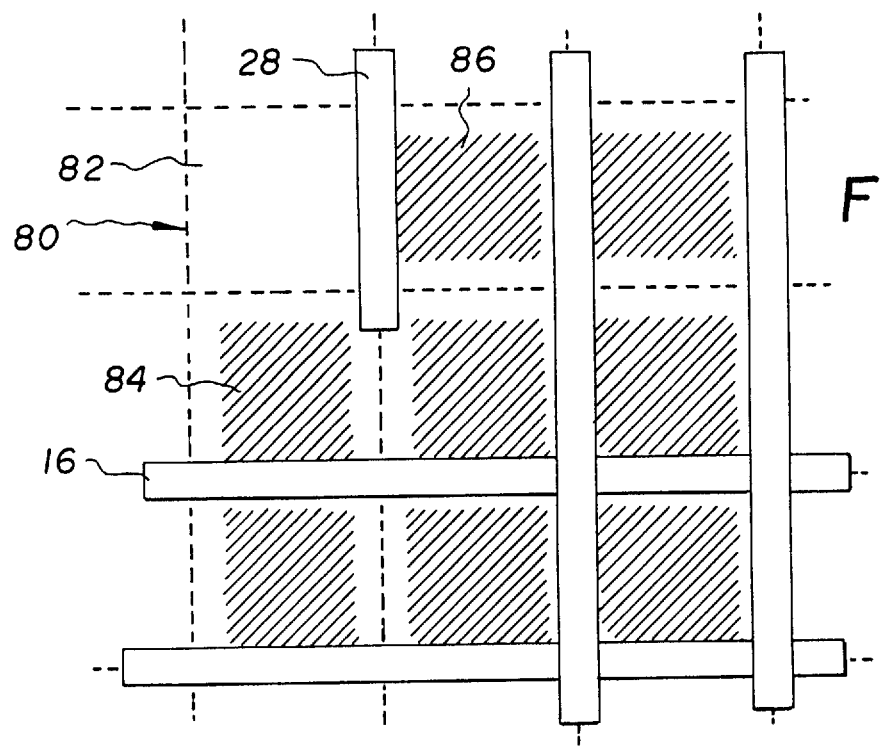

FIG. 4a and FIG. 4b are sectional views showing conductive traces 16 and 28. The conductive traces 16 and 28 are orthogonal and define pixel elements 80. Horizontal traces 16 and vertical traces 28 are opaque and frame each pixel elements 80 in this embodiment. A clear aperture 82 acts as the light modulating area for each pixel elements 80. Horizontal traces 16 have a vertical filament grid 84 across clear aperture 82. Vertical filament grid 84 can be composed of two sets of filaments 5 microns wide and pitched 15 microns apart that are orthogonal to each other and pitched a 45 degree angle. Horizontal filament grid 86 are similar in structure to vertical filament grid 84 and run horizontally from each vertical trace 28. The intersection of two sets of filaments grids across clear aperture 82 spread electrical charge from the traces 16 and 28 across clear aperture 82. Stated differently, the vertical and horizontal first and second conductive traces are aligned so that when a potential is applied between them, a field is produced which operates upon the light modulating material layer 30 to selectively transmit light which passes through first light sensitive layer 14, light modulating layer 30, second light sensitive layer 24, substrate 12, and the color filter array 40 so that a displayed image is produced.

Figure 5A:
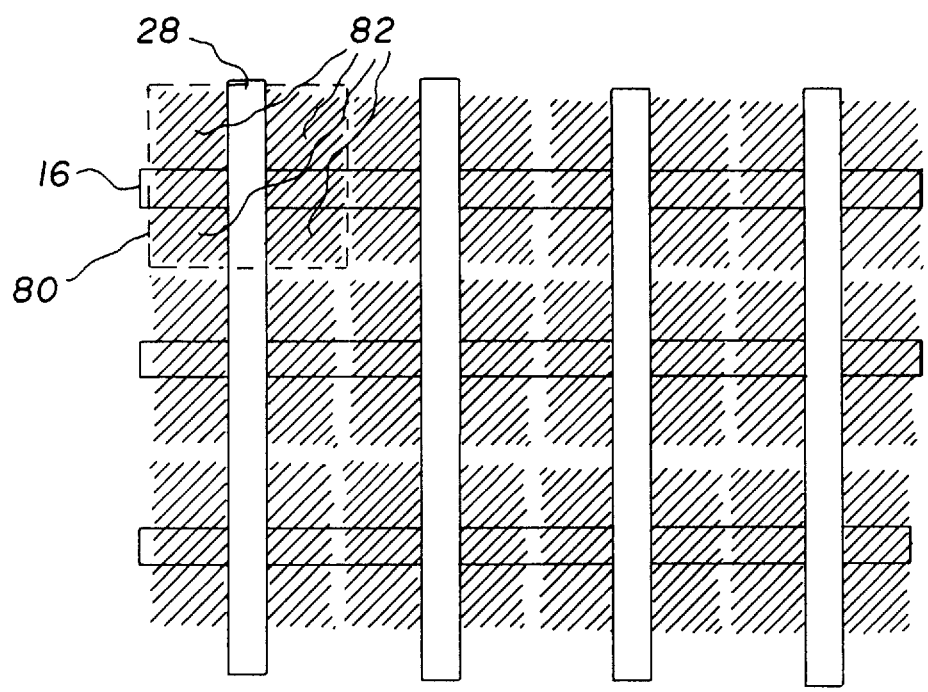
FIG. 5a is a top view of a portion of the display in accordance with another embodiment of the invention.
Figure 5B:
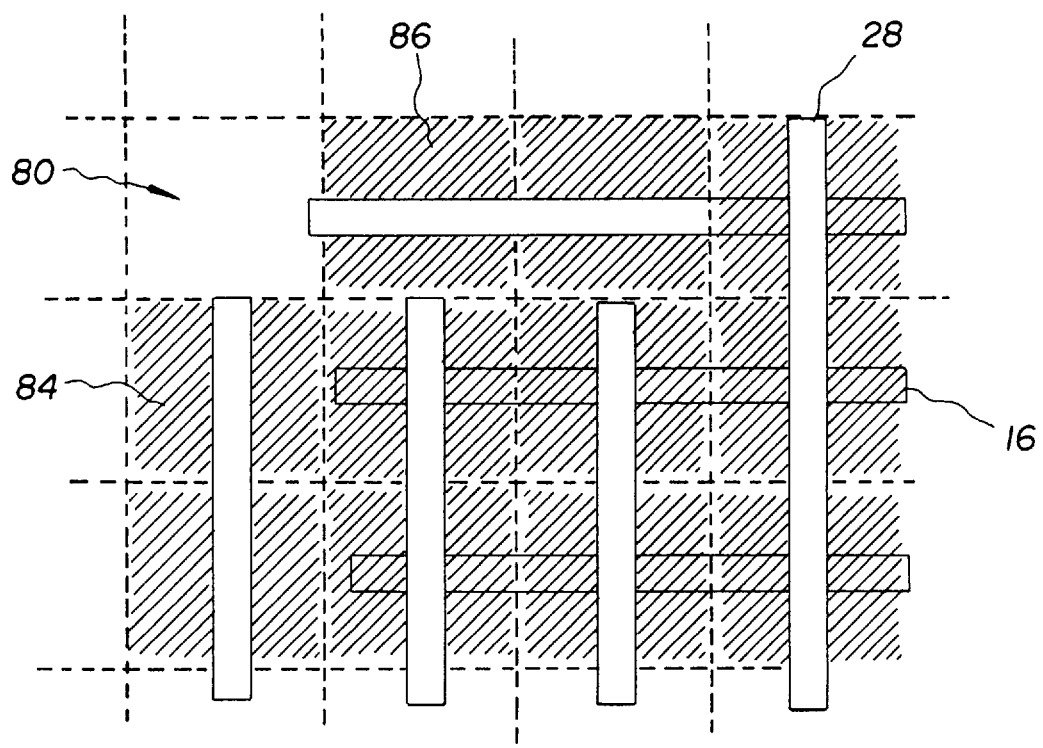

In an alternative embodiment, a pixel elements 80 is defined as the four quadrants around the intersection of the traces 16 and 28 as shown in FIG. 5a and FIG. 5b. The filament grids 84 and 86 are disposed into each of the four quadrants. This alternative structure has the advantage that an electrical field is stretched less than half way across clear aperture 82. This reduces field loss across the filament grids 84 and 86 by reducing the distance that the filament grids 84 and 86 have to spread charge.

The areas between filament grids 84 and 86 can be exposed to a level of radiation that causes limited metallic silver to be deposited in the clear openings between the filaments grids 84 and 86. Alternatively, a non-photosensitive, electrically conductive material such as fine Indium-Tin Oxide with particle size between 0.5 and 2 microns can be incorporated in layers 14 and 24 to spread the electrical field across opening between the filament grids 84 and 86 In another embodiment, Indium-Tin Oxide is sputter coated on substrate 12 before light sensitive layers 14 and 24 (see FIG. 1) are applied. In the case when ITO is sputtered, the sputtered material acts to spread charge across substrate 12 in the vicinity of horizontal traces 16. This permits improvements in light transmission properties through clear aperture 82 in the first light sensitized layer 14. Some light striking each pixel elements 80 is blocked by the opacity of the traces 16 and 18 and filaments grids 84 and 86, and the remainder is controlled by the electrically field between processed first light sensitive layer 14 and processed second light sensitive layer 24.

Figure 6:
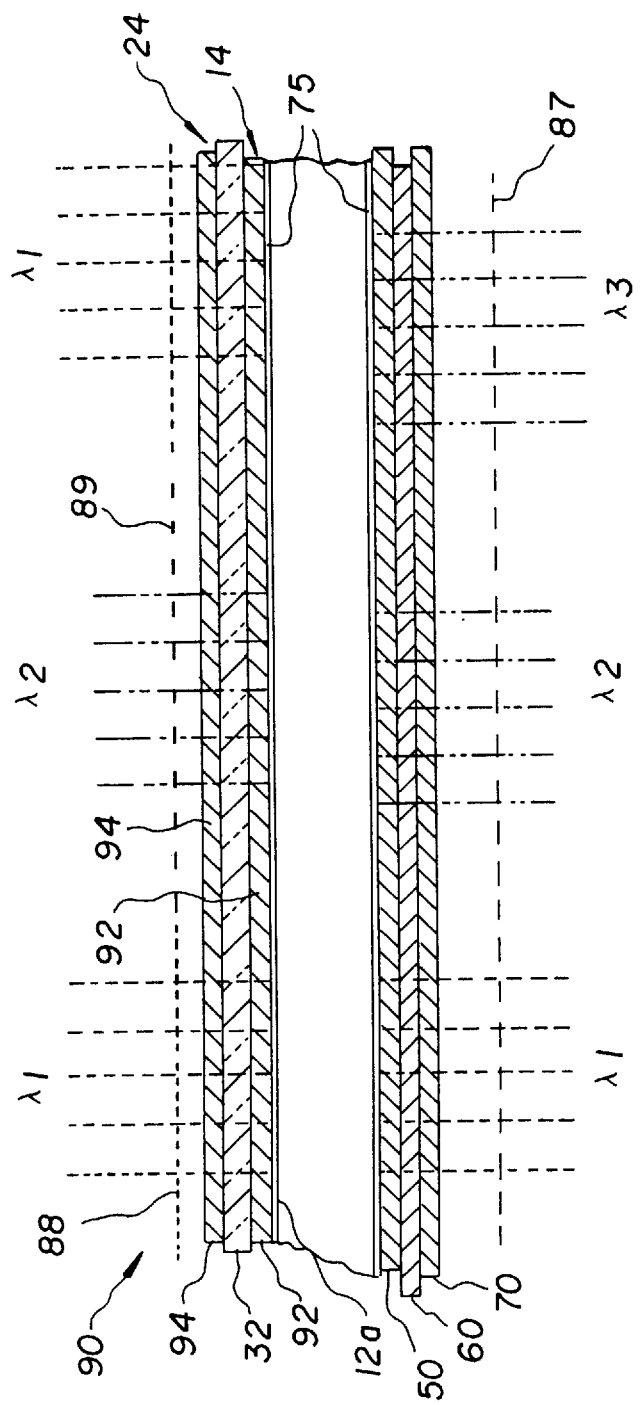
FIG. 6 is a sectional view showing light writing to the unprocessed sheet of FIG. 1.

FIG. 6 shows the trace mask 90 forming conductive traces 16 and 28. In this embodiment, the trace forming chemistry is designed to form silver conductive traces in the area that are activated by light. A pan-chromatic light source (not shown) provides light of all wavelengths to trace mask 90. Trace mask 90 has colored areas 88 and 89 that selectively block portions of the wavelengths of the panchromatic light so that areas of the trace mask 90 pass colored light at specific wavelengths. Light sensitive layers 14 and 24 are conventional silver halide crystals coated with conventional light sensitizing dye. A dot in the center of triangles representing silver halide grains indicates silver halide grains have been exposed. Light sensitive layer 14 responds to a first wavelength, $\lambda_1$ and light sensitive layer 24 responds to a second wavelength of light, $\lambda_2$. As described earlier, light sensitive layer 14 is sensitized to green light and trace mask 90 includes a green first dye 88 over those areas that require conduction in light sensitive layer 14 and non conduction in light sensitive layer 24. Light sensitive layer 24 is sensitized to red radiation and red second dye 89 is disposed in those areas that require conduction in light sensitive layer 24 and non-conduction in light sensitive layer 14. In the dyed areas, only a specific wavelength passes through and develops silver in only one of the two layers 14 and 24.

The three filter layers 50, 60 and 70 of color filter array 40 have sensitized silver halide crystals that have been sensitized to different wavelengths of light. Light absorbing material 75 permits the use of wavelengths that use the same wavelength of light which is used to form conductive traces 16 and 28. A color filter mask 87 has filtered areas that permit passage of a selected radiation of light that matches the light sensitivity of a selected color filter layer. Color filter mask 87 is aligned with trace mask 90 in either a separate or simultaneous exposure step so that color filter array 40 is aligned with conductors on the first substrate surface 12a. This can be done by placing trace mask 90 and color filter mask 87 in alignment frames and positioning unprocessed display 5 between the two masks. Light is then applied though the masks to simultaneously expose both surfaces of display 5. The simultaneous exposure in a single frame ensures accurate alignment. Alternatively, a series of mask can be used using different light sources emitting at specific wavelengths of light.

Figure 7A:
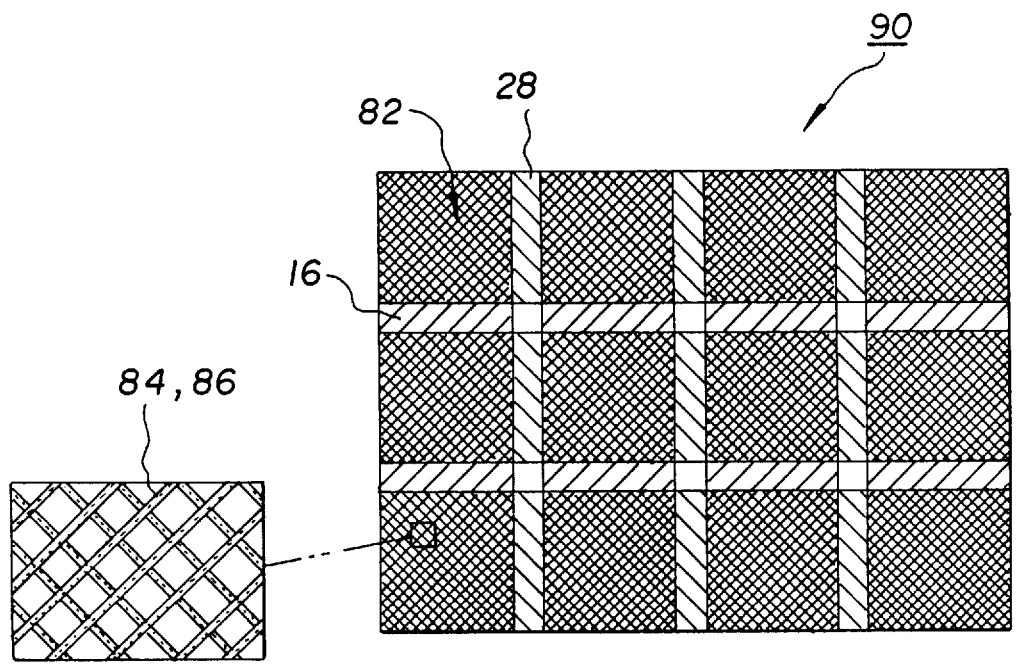
FIGS. 7a and 7b shows masks that can be used for forming conductive traces in accordance with the invention.
Figure 7B:
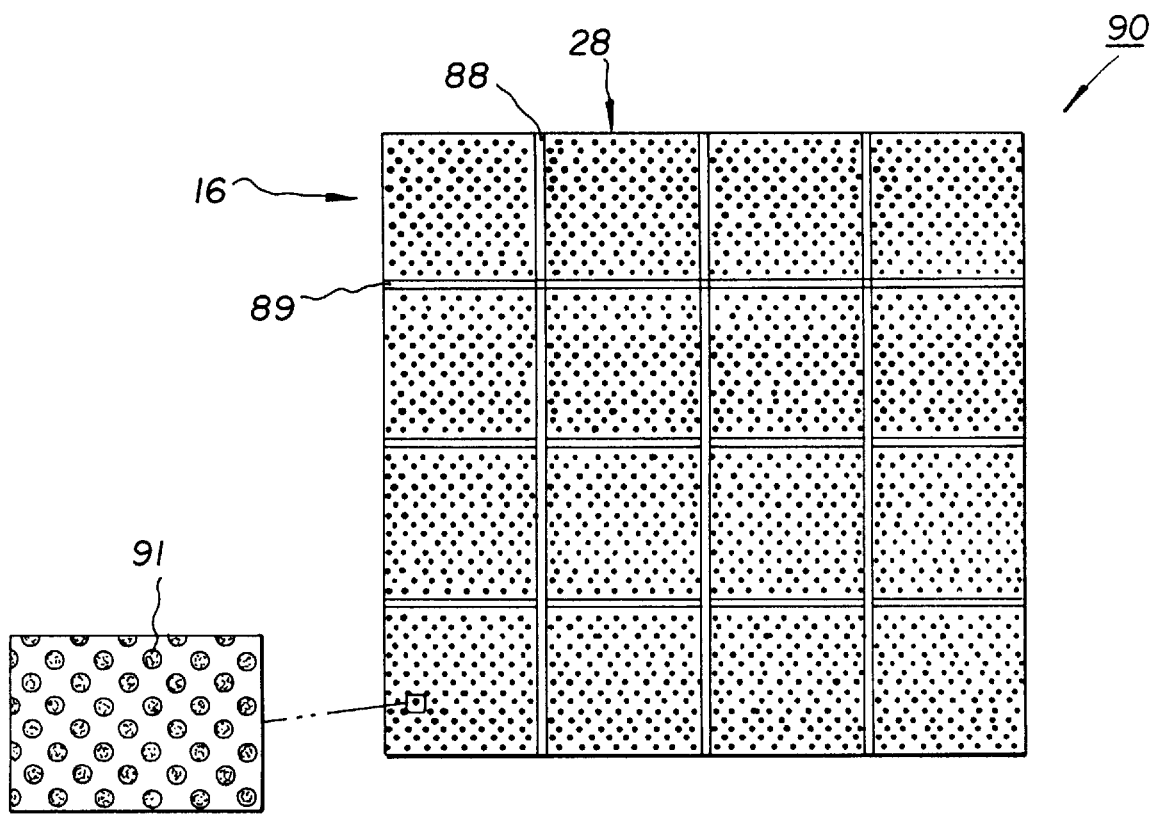

A top view of example trace masks 90 are shown in FIGS. 7a and 7b. FIG. 7a depicts a trace mask 90 according to a preferred embodiment. Areas corresponding to horizontal traces 16 are coated with green dye. Areas that correspond to vertical traces 28 contain red dye. Where the two traces intersect, no dye is applied because silver is needed on both layers 14 and 24. The areas corresponding to clear aperture 82 are coated with black dye that blocks light from forming silver in the clear aperture 82. The filament grids 84 and 86 across clear aperture 82 are formed by clear lines formed in the black dye across areas corresponding to clear aperture 82.

An alternative trace mask 90 is shown in FIG. 7b. Because the filament grids 84 and 86 (FIG. 7a) are fragile, in an alternative embodiment filament grids 84 and 86 are eliminated and conductive traces 16 and 28 are disposed across most of pixel elements 80. Each conductive trace 16 and 28 are electrically separated from adjacent conductive traces 16 and 28 by a narrow horizontal gap 88 and a narrow vertical gap 89. In this alternative embodiment, a pixel elements 80 can be 500 micron square and having 25 micron width for gaps 88 and 89. Horizontal gaps 88 block silver formation only for green-sensitive horizontal conductive traces 16 and are magenta dyed. Vertical gaps 89 block silver formation only in red-sensitive vertical conductive traces 28 and are cyan dyed.

Opaque points in the large, clear areas that form traces 18 and 16 correspond to light apertures 91. Light apertures 91 act as light emitting pores through intersections of traces 18 and 16. Light apertures 91 can be staggered linear arrays sized to have 10 micron openings on 13.5 micron centers that are offset by 11.6 microns to yield 50 percent effective light transmission through traces 18 and 16. The diameter and spacing of light apertures 91 is controlled to maximize electrical conductivity along traces 16 and 28, while maximizing light conductivity through display 5.

Figure 8A:
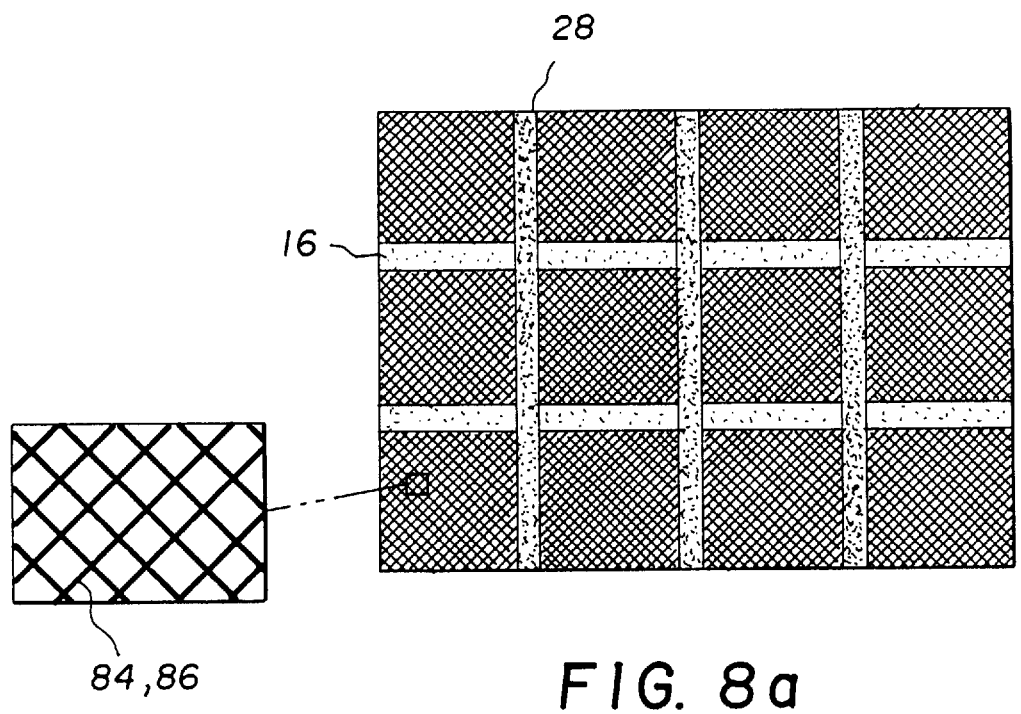
FIGS. 8a and 8b are top views of display structures formed by the masks in FIGS. 8a and 8b respectively.
Figure 8B:
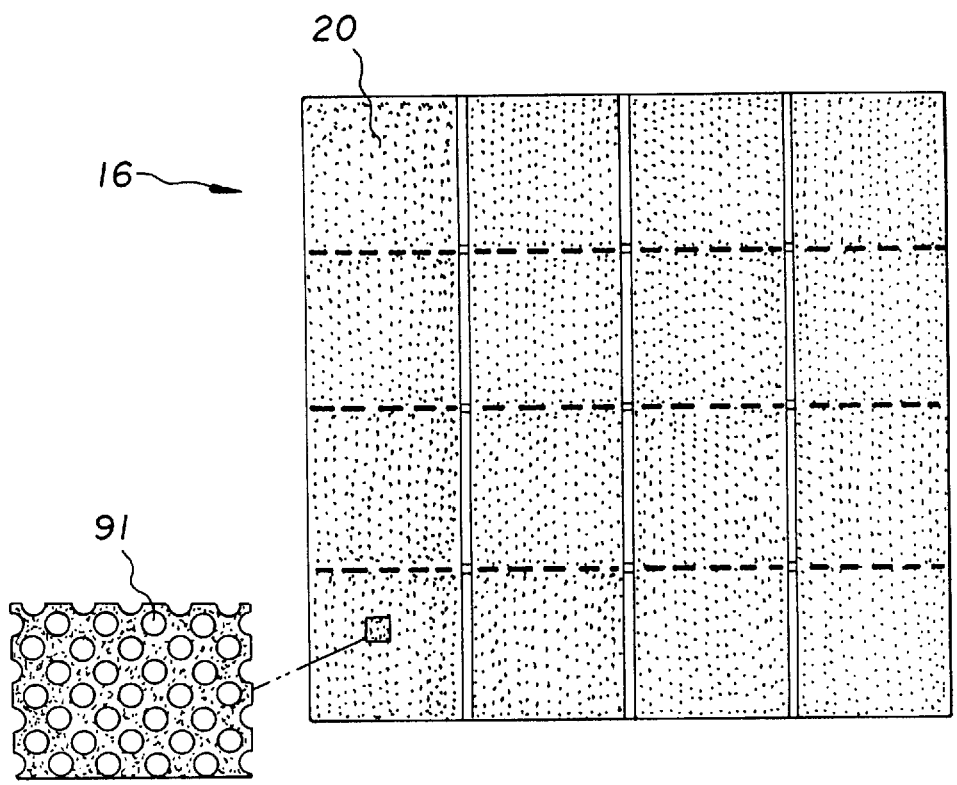

A processed display 5 is shown in FIGS. 8a and 8b. FIG. 8a is a completed according to a trace-filament design. Traces 16 and 28 have been formed in their respective layers; not shown is that horizontal traces 16 are conductive under traces 28. A close-up view of clear aperture 82 discloses filament grids 84 and 86.

FIG. 8b is a display 5 made according to the wide-trace design. Traces 16 and 28 are nearly full width across each pixel elements 80. A close-up view at the trace structure shows light apertures 91 formed through both layers 14 and 24 (See FIG. 6). Light modulating material 32 controls light passing through light apertures 91 in response to electric fields at the intersection of traces 16 and 28. Color filter array 40 can be pre-formed or processed in conjunction with the formation of electrical conductors on the first substrate surface 12a.

Figure 9:
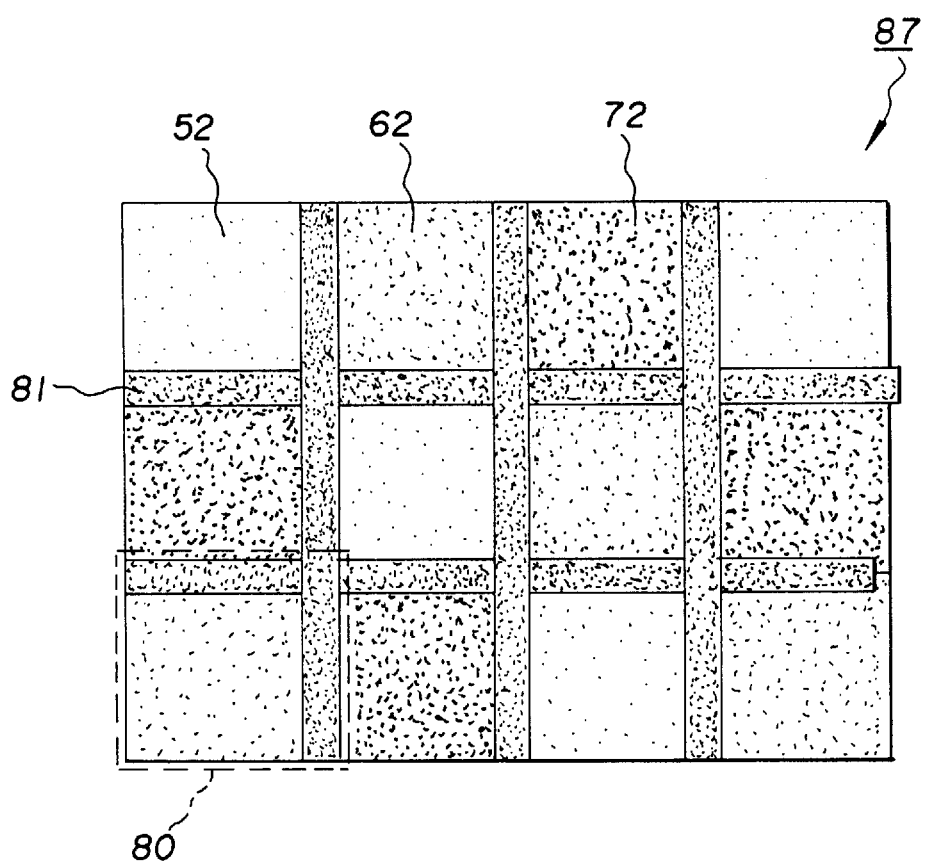
FIGS. 9 is a top view of another mask that can be used for forming conductive traces in accordance with the invention.

FIG. 9 is an example of a color filter mask 87 that can be used to form color filter array 40. Color areas corresponding to red filter dye area 52, green filter dye area 62 and blue filter dye area 72 are formed in a repeating pattern. A pixel mask 81 can be formed at the boundaries of pixel elements 80 to mask stray light from adjacent pixels or to block openings between traces in the alternative embodiment.

Separate chemical processing is required for color filter array 40 and light sensitive layers 14 and 24. Such processing can be done concurrently or as separate steps. In the case of electrically conductive trace forming, silver must be retained. In the case of color dye formation, the dyes are formed by known color dye forming processes. In one case, dye forming chemistry is located within each layer. Development of silver halide into silver metal depletes the development chemistry, and in the process converts dye precursors into dye. Because the developed silver is opaque, and undeveloped silver halide would be converted to silver in the presence of light, all silver must be extracted. Thus, a second conventional bleach-fixing step extracts all silver from the filter layers. In an alternative process, the dye precursors are in the developing agent and three separate development processes sequentially deposit dye in each layer. Again, a secondary step extracts the silver from the color filter layers.

Figure 10A:
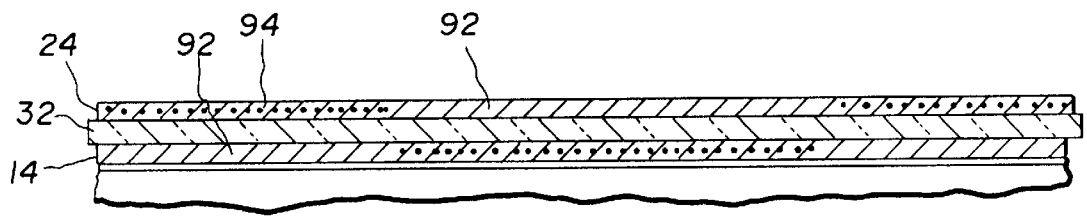
FIGS. 10a–10e show various steps in the formation of the conductive traces in accordance with the present invention.
Figure 10B:
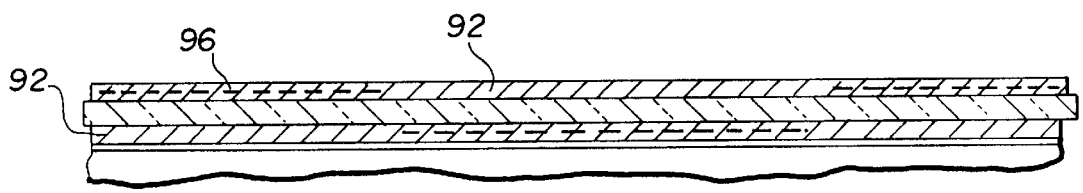
Figure 10C:
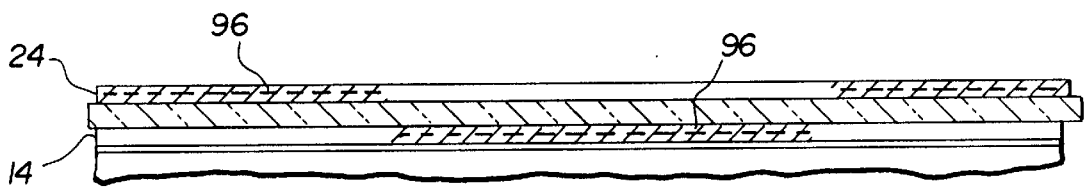
Figure 10D:
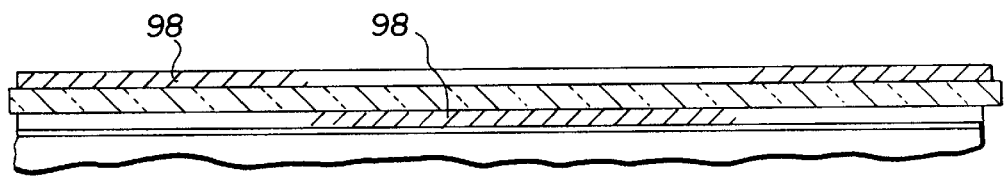
Figure 10E:
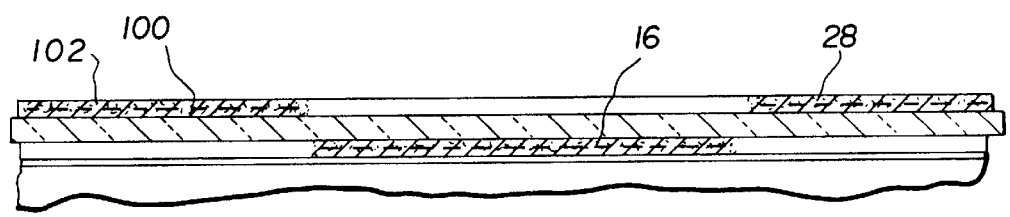

FIGS. 10a–e are schematics cross-sections representing different steps in the process of forming conductive traces 16 and 28 formed in light sensitive layers 14 and 24. Process that can be used are disclosed in U.S. Pat. No. 3,033,765 and U.S. Pat. No. 3,464,822, the disclosure of which are incorporated herein. In this embodiment, unexposed silver halide 92 is the light sensitive material. In order to understand FIG. 10a it is in fact a part of FIG. 6. Trace mask 90 passes light at wavelengths that strikes exposed silver halide 94 without affecting unexposed silver halide 92. In FIG. 10b the light sensitive layers 14 and 24 are photographically developed to convert exposed silver halide 94 to metallic silver 96. In FIG. 10c, a conventional photographic fixing step was used to remove the unexposed silver halide 92. In FIG. 10d, metallic silver 96 has been re-halogenated by a bleach to form re-halogenated silver 98. In FIG. 10e, re-halogenated silver 98 has been developed to form redeveloped silver 100. Metallic salts in the developer are used to deposit additional metal 102 to improve conductivity. In an alternative process, the silver metal particles in gelatin are subjected to a first plating bath to deposit palladium metal onto the silver grains. A final plating bath of copper salts adds additional conductor to improve the conductivity of the traces 16 and 28.

Figure 11A:
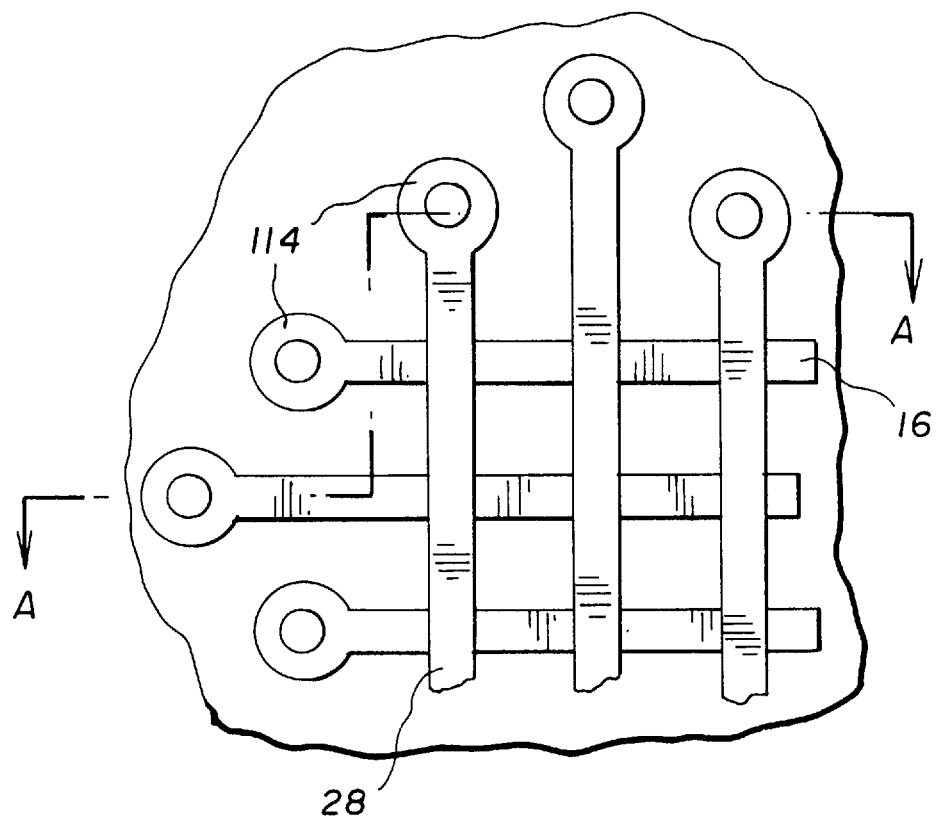
FIG. 11a is a top view showing the termination of the conductive traces on a display made in accordance with the present invention.
Figure 11B:
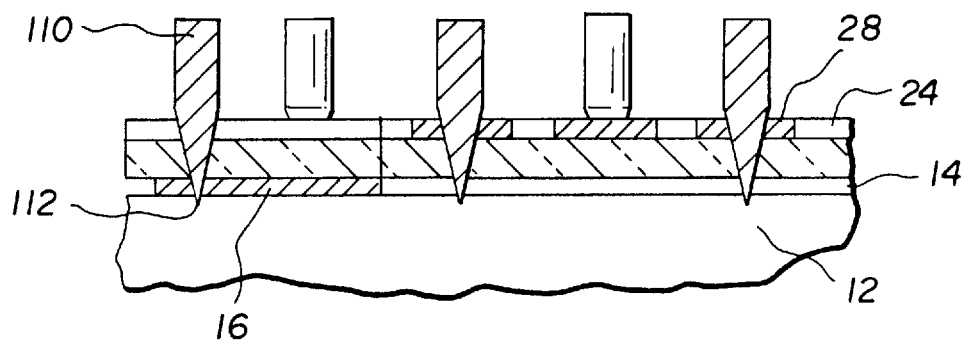

Electrical connection to display 5 is shown in FIGS. 11a and 11b. Horizontal traces 16 and vertical traces 28 terminate in a staggered pattern of conductive pads 114. Pins 110 having a piercing point 112 and are disposed in a rigid non-conductive substrate (not shown). The pins 110 are pressed into display 5 so that piercing points 112 are driven through the conductive pads 114 at the end of each trace 16 and 28. The piercing action provides an electrical interconnection between the traces 16 and 28 of the display 5.

The invention has been described in detail with particular reference to certain preferred embodiments thereof, but it will be understood that variations and modifications can be effected within the spirit and scope of the invention.

PARTS LIST 5 display
12 substrate
12a first substrate surface
12b second substrate surface
14 first light sensitive layer
16 horizontal traces
24 second light sensitive layer
26 second layer non-conducting areas
28 second layer conducting areas (vertical traces)
30 light modulating layer
32 light modulating material
40 color filter array
50 red filter layer
52 red filter dye area
54 red filter undyed area
60 green filter layer
62 green filter dye area
64 green filter undyed area
70 blue filter layer
72 blue filter dyed area
74 blue filter undyed area
75 light absorbing material
80 pixel elements
81 pixel mask
82 clear aperture
84 vertical filament grid
86 horizontal filament grid
87 color filter mask
88 first dye
89 second dye
90 trace mask
91 light aperture
92 unexposed silver halide
94 exposed silver halide
96 metallic silver
98 re-halogenated silver
100 redeveloped silver
102 additional metal
110 pins
112 piercing point
114 conductive pads

What is claimed is:

1. A method of fabricating a display having light sensitive conductive traces, comprising the steps of:

a) providing first and second light sensitive layers respectively over both sides of an electrically sensitive light modulating layer, the first and second light sensitive layers being conductive and patternable;

b) patterning the first light sensitive layer to a first wavelength of radiation to form first conductive traces; and c) patterning the second light sensitive layer to a second wavelength of radiation to form second conductive traces.

2. The invention of claim 1 wherein said first and second conductive traces form an orthogonal pattern of pixel elements.

3. The invention of claim 2 further including the step of improving the conductivity of the first and second conductive traces by the addition of metal to the first and second conductive traces.

4. The invention of claim 1 wherein the first and second light sensitive layers include silver halide crystals and the patterning steps each include development of sensitized and non-sensitized silver halide crystals to metallized and non metallized areas within the first and second light sensitized layers.

5. The method of claim 1 further including providing a color filter array on one side of the display by:
   d) exposing light-sensitive dye forming layers to separable wavelengths of light to selectively sensitize a color filter precursor on the display; and
   e) processing the exposed light-sensitive dye forming layers to provide a color filter array.

6. A method of fabricating a display having light sensitive conductive traces and a color filter array, comprising the steps of:
   a) providing first and second light sensitive layers respectively over both sides of an electrically sensitive light modulating layer, the first and second light sensitive layers being conductive and patternable;
   b) patterning the first light sensitive layer to a first wavelength of radiation to form first conductive traces;
   c) patterning the second light sensitive layer to a second wavelength of radiation to form second conductive traces
   d) providing a light blocking layer have a soluble dye over one of the conductive traces and light-sensitive dye forming layers over the light blocking layer;
   e) exposing light-sensitive dye forming layers to separable wavelengths of light to selectively sensitize a color filter precursor on the display;
   g) processing the exposed light-sensitive dye forming layers to provide a color filter array; and
   f) removing soluble dye from the light-blocking layer.

* * * * *